(12) United States Patent
Grimm et al.

(10) Patent No.: US 10,280,071 B2
(45) Date of Patent: May 7, 2019

(54) METHOD FOR PRODUCING A ROLLED-UP ELECTRICAL OR ELECTRONIC COMPONENT

(71) Applicant: LEIBNIZ-INSTITUT FUER FESTKOERPER-UND WERKSTOFFFORSCHUNG DRESDEN E.V, Dresden (DE)

(72) Inventors: Daniel Grimm, Dresden (DE); Dmitriy Karnaushenko, Dresden (DE); Martin Bauer, Dresden (DE); Daniil Karnaushenko, Dresden (DE); Denys Makarov, Dresden (DE); Oliver G. Schmidt, Dresden (DE)

(73) Assignee: LEIBNIZ-INSTITUT FUER FESTKOERPER-UND WRKSTOFFFORSCHUNG DRESDEN E.V, Dresden (DE)

( * ) Notice: Subject to any disclaimer, the term of this patent is extended or adjusted under 35 U.S.C. 154(b) by 0 days.

(21) Appl. No.: 15/529,012

(22) PCT Filed: Nov. 19, 2015

(86) PCT No.: PCT/EP2015/077070
§ 371 (c)(1),
(2) Date: Jul. 12, 2017

(87) PCT Pub. No.: WO2016/083227
PCT Pub. Date: Jun. 2, 2016

(65) Prior Publication Data
US 2017/0362080 A1 Dec. 21, 2017

(30) Foreign Application Priority Data
Nov. 24, 2014 (DE) .......................... 10 2014 223 873

(51) Int. Cl.
*B81B 3/00* (2006.01)
*H01L 49/02* (2006.01)
(Continued)

(52) U.S. Cl.
CPC .............. *B81B 3/0035* (2013.01); *B81B 3/00* (2013.01); *B81B 3/0048* (2013.01);
(Continued)

(58) Field of Classification Search
CPC .............. B81C 1/00007; B81C 1/0019; B81C 1/00206; B81C 1/00166; B81C 1/00539;
(Continued)

(56) References Cited

U.S. PATENT DOCUMENTS 6,245,444 B1 *  6/2001  Marcus .............. G01R 1/06733
                                                       267/156
7,621,761 B2 * 11/2009  Mok ....................... C23C 18/00
                                                        439/66
(Continued)

FOREIGN PATENT DOCUMENTS

DE      101 59 415      6/2003
EP      2 023 357       2/2009
(Continued)

OTHER PUBLICATIONS

R. Sharma et al., "Adv. Energy Mater.", 4, 2014, pp. 1301631.
(Continued)

*Primary Examiner* — Eduardo A Rodela
(74) *Attorney, Agent, or Firm* — Greenblum & Bernstein, P.L.C.

(57) ABSTRACT

The present invention relates to the fields of physics, material sciences and micro and nano electronics, and concerns a method for producing a rolled-up electrical or electronic component, as can be used for example as a capacitor, or in aerials. The object of the present invention is to provide a
(Continued)

low-cost, environmentally friendly and time-saving method for producing a rolled-up electrical or electronic component with many windings. The object is achieved by a method for producing a rolled-up component in which at least two functional and insulating layers, alternately arranged fully or partially over one another, are applied to a substrate with a sacrificial layer, wherein at least the functional or insulating layer that is arranged directly on the sacrificial layer has a perforation, at least on the two sides that are arranged substantially parallel to the rolling direction.

18 Claims, 3 Drawing Sheets

(51) Int. Cl.
    *B81C 99/00*     (2010.01)
    *H01G 4/32*     (2006.01)
    *B81C 1/00*     (2006.01)
    *H01G 4/008*     (2006.01)
    *H01G 4/06*     (2006.01)

(52) U.S. Cl.
    CPC .......... *B81B 3/0051* (2013.01); *B81B 3/0054* (2013.01); *B81B 3/0059* (2013.01); *B81C 1/00166* (2013.01); *B81C 1/00539* (2013.01); *B81C 99/008* (2013.01); *B81C 99/0095* (2013.01); *H01G 4/32* (2013.01); *H01L 28/40* (2013.01); *H01G 4/008* (2013.01); *H01G 4/06* (2013.01)

(58) Field of Classification Search
    CPC ...... B81C 2201/0161; B81C 2201/017; B81C 2203/07; B81C 2203/0707; B81C 2203/0714; B81C 2203/0728; B81C 2203/0735; B81C 2203/0742; B81B 3/00; B81B 3/0035; B81B 3/0051; B81B 3/0054; B81B 3/0048; B81B 3/0059; B81B 3/0072; B81B 3/0097; B81B 2203/019; H01L 28/10; H01L 28/20; H01L 28/40; H01L 2924/1205; H01L 2924/1206; H01L 2924/19041; H01L 2924/19042

See application file for complete search history.

(56) References Cited

U.S. PATENT DOCUMENTS

| | | | |
|---|---|---|---|
| 8,941,460 B2* | 1/2015 | Li | H01L 21/4814 336/200 |
| 2003/0027081 A1* | 2/2003 | Chua | H01F 17/02 430/320 |
| 2013/0187169 A1* | 7/2013 | Taylor | H01L 21/28506 257/76 |
| 2013/0192476 A1* | 8/2013 | Broerman | A23B 4/044 99/482 |
| 2014/0103486 A1* | 4/2014 | Li | H01L 23/645 257/531 |
| 2014/0234977 A1* | 8/2014 | Grimm | H01L 29/66522 436/39 |

FOREIGN PATENT DOCUMENTS

| | | |
|---|---|---|
| GB | 811 983 | 4/1959 |
| WO | 2010/129319 | 11/2010 |

OTHER PUBLICATIONS

C.C.B. Bufon et al., "Nano Letters", 10, 2010, pp. 2506-2510.
V. Luchnikov et al., "Advanced Materials", 17, 2005, pp. 1177-1182.
C.S. Martinez-Cisneros et al., "Nano Lett.", 14, 2014, pp. 2219.
D.J. Bell et al., "Sensors & Actuators A", 130, 2006, pp. 54-61.
I. Mönch et al., "Smart Mater. Struct.", 20, 2011, pp. 85016.
D. Grimm et al., "Nano Lett.", 13, 2013, pp. 213.
S.M. Harazim et al., "Lab Chip", 12, 2012, pp. 2649.
C. Yan et al., "Adv. Mater.", 25, 2013, pp. 539.
J. Deng et al., "Angew. Chem. ", 125, 2013, pp. 2382.
S.V. Golod et al., "Freestanding SiGe/Si/Cr and SiGe/Si/SixNy/Cr microtubes", Applied Physics Letters, American Institute of Physics, vol. 84, No. 17, Apr. 26, 2004, pp. 3391-3393.
Prinz et al., "A new technique for fabricating three-dimensional micro- and nanostructures of various shapes", Nanotechnology, vol. 12, No. 4, Dec. 1, 2001, pp. 399-402.

* cited by examiner

METHOD FOR PRODUCING A ROLLED-UP ELECTRICAL OR ELECTRONIC COMPONENT

The present invention concerns the fields of physics, materials science, and micro- and nanoelectronics and relates to a method for producing a rolled-up electrical or electronic component, such as can be used for example in electrical and electronic components as a capacitor, or in inductive and/or resistive three-dimensional elements or in antennas.

Our electronically mobile society constantly demands new achievements/improvements so that ultra-compact integrative components for mobile use can be used comfortably on the go. Capacitors can be found in virtually every electrical and electronic device.

For the electrical capacitance of a capacitor, the area of the electrically conductive layer is important. The larger this area is, the greater the electrical capacitance.

However, it must thereby be kept in mind that capacitors are built into electrical or electronic devices as electrical components. The installation footprint necessary for this should therefore be as small as possible. The smaller this installation footprint is, the more compactly the electrical or electronic device can be built.

For this purpose, developments have recently been focused on miniaturization in microelectronics, in particular on reducing the size of transistors and discrete passive elements, such as inductors or capacitors [R. Sharma et al., Adv. Energy Mater., 2014, 4, 1301631].

In roll-up technology, layers are applied to a substrate and are subsequently rolled up. The rolling-up mechanism is achieved by an application of the layers in a tensioned state and a subsequent release by means of a removal of the layers from the substrate.

According to WO 2010/129319 A2, plasma or wet-chemical etching of a silicon substrate is known so that the tensioned two-dimensional structure deposited thereupon is rolled up and formed into a three-dimensional structure.

According to Bufon, layer structures that are arranged on a sacrificial layer and rolled up by removal of the sacrificial layer are known. The speed at which the sacrificial layer can be undercut and the tensioned layer separated from the substrate is thereby maximally 100 µm/h [C. C. B. Bufon et al., Nano Letters, 2010, 10, 2506-2510].

Also, according to EP 2 023 357 B1, a method for the production of capacitors is known in which a layer structure is rolled up by dissolution of a sacrificial layer. A hydrogel can also be used as a lower part of the layer structure, which hydrogel is placed in contact with water, thereby absorbs the water, swells up, and causes the rolling-up of the layer stack (V. Luchnikov et al., Advanced Materials 2005, 17, 1177-1182).

According to DE 101 59 415 B4, the production of micro- and nanoscopic coils, transformers and capacitors by a rolling-up or folding-down of conductive layers during the removal of auxiliary layers from a substrate is known. To do so, an auxiliary layer that was previously applied between a conductor track and a substrate is removed from the substrate, and the conductor track is rolled up as a result. Germanium or aluminum arsenide is thereby used as an auxiliary layer. Ge/GeO$_x$ is also used as a sacrificial layer according to Sharma, and this layer is removed by means of a wet-etching solution, 2% H$_2$O$_2$ [R. Sharma et al., Adv. Energy Mater., 2014, 4, 1301631]. Furthermore, fluidic sensor elements can be produced using a similar etching technique [C. S. Martinez-Cisneros et al., Nano Lett. 2014, 14, 2219]. Also known is the use of H$_2$O$_2$ to remove tensioned multi-layers of virtually monocrystalline Si and Ge from the substrate in order to fabricate microhelical structures for electromechanical sensor elements [D. J. Bell et al., Sensors & Actuators A 2006, 130, 54-61].

Other rolled-up microcomponents use different inorganic sacrificial layers. Aluminum arsenide (AlAs) is used as a sacrificial layer in the case of rolled-up transistors [D. Grimm et al., Nano Lett. 2013, 13, 213]. The AlAs sacrificial layer is removed with a mixture of wet-etching HCl or HF.

According to [I. Mönch et al., Smart Mater. Struct. 2011, 20, 85016], rolled-up resistors can be produced in that a 1.5-µm thick photoresist is used as a sacrificial layer. This photoresist is removed using solvents, typically acetone. Other applications that are produced using a similar etching technique involve microfluidic sensor elements [S. M. Harazim et al., Lab Chip 2012, 12, 2649] and microbatteries with a large active surface per volume [C. Yan et al., Adv. Mater. 2013, 25, 539; J. Deng et al., Angew. Chem. 2013, 125, 2382].

A disadvantage of the known prior art is that the production of rolled-up components, such as for example capacitors, antennas, resistors and coils, advantageously requires large active component areas and therefore long rolling lengths with a comparatively long length of time for the rolling-up process.

If a sacrificial layer is used, it must be removed by means of selective etching. Diluted hydrogen peroxide, acid or organic solvents, which are hazardous to human skin, are used as etchant, for example. The use of water in the case of a GeO$_x$ sacrificial layer is also known, though only very low rolling-up speeds can be achieved. In a longer application, particularly hydrogen peroxide, acids and DI water have a corrosive effect on metal layers and are therefore a significant disadvantage for long rolling times. The use of photoresist as a sacrificial layer for components with long rolling-up lengths is not possible, since the necessary photolithographic process steps require the use of solvents, which in turn attack the photoresist sacrificial layer.

A further disadvantage is that a straight rolling-up of the layer stack over long distances cannot be ensured in a reproducible manner, and that the usable rolling-up length is thus limited.

The object of the present invention is the specification of a cost-effective, environmentally friendly and time-saving method for producing a rolled-up electrical or electronic component having a plurality of coils.

The object is attained by the invention disclosed in the claims. Advantageous embodiments are the subject matter of the dependent claims.

In the method according to the invention for producing a rolled-up component, at least two functional and insulating layers alternately arranged fully or partially over one another are applied to a substrate having a sacrificial layer, wherein at least the functional or insulating layer that is arranged directly on the sacrificial layer comprises a perforation at least on the two sides that are arranged essentially parallel to the rolling direction.

Advantageously, the perforation is composed of a rib-like structuring and the ribs have a basic quadrilateral shape.

Also advantageously, in the basic quadrilateral shape of the ribs one of the sides of the ribs is arranged essentially parallel to the rolling direction of the layers and is part of the edge of the layer to be rolled up and has a lateral length (B) of 1 to 1000 µm, and the other side of the ribs essentially parallel to the rolling direction of the layers is arranged at a distance (H) of 5 to 200 µm from the edge of the layer to be rolled up and has a distance between the ribs of 20 to 4000 µm, and the angle (α) between the side of the ribs that is first in the rolling direction and the edge of the layer to be rolled up outside the rib is between 15° and 135°, and the angle (β) between the side of the ribs that is last in the rolling direction and the edge of the layer to be rolled up outside the rib is between 45° and 135°, and subsequently the sacrificial layer is fully or partially removed and the layer stack is rolled up.

Also advantageously, a rigid or flexible material is used as a substrate.

And also advantageously, a substrate of silicon, silicon oxide, glass, ceramic, or a film of poly(ethylene terephthalate) (PET) or polyether ether ketone (PEEK), and a sacrificial layer of poly(vinyl alcohol) (PVA), poly(acrylic acid) (PAA), biopolysaccharides, cellulose acetate, poly(allylamine) (PAH), methylcellulose or ethylcellulose are used.

It is also advantageous if, as functional layers, layers of an electrically conductive material and, as insulating layers, layers of a dielectric and/or electrically insulating material are applied by means of atomic layer deposition and/or chemical vapor deposition.

It is likewise advantageous if a layer stack is applied to the sacrificial layer, which layer stack is composed of a layer of at least one dielectric and/or electrically insulating material, a layer of at least one first electrically conductive material, an additional layer of at least one dielectric and/or electrically insulating material, and a layer of at least one second electrically conductive material, and in which layer stack the layers of the dielectric and/or electrically insulating material essentially completely cover the layers of the electrically conductive material.

It is further advantageous if Ti, Cr, Al, Au, Ni, Pd, Cu, W, Ta and compounds thereof, or indium tin oxide or highly doped semiconductor material are used as material for electrically conductive layers.

And it is also advantageous if $AlO_x$, advantageously $Al_2O_3$, $SiO_x$, advantageously $SiO_2$, $AlTiO_x$, $SiTiO_x$, $HfO_x$, $TaO_x$, $ZrO_x$, $ZrSiO_x$, $TiZrO_x$, $TiZrWO_x$, $TiO_x$, $SrTiO_x$, $PbTiO_x$, $SiAlO_x$, metal nitrides, aluminum nitrides $AlN_y$, silicon nitrides $SiN_y$, $AlScN_y$, metal oxynitrides, aluminum oxynitrides $AlO_xN_y$, silicon oxynitrides $SiO_xN_y$, $HfSiO_xN_y$ and/or $SiC_zO_xN_y$ are used as material for dielectric and/or insulating layers.

It is also advantageous if at least one layer that is applied directly to the sacrificial layer has a rolling-up length of 1 mm to 30 mm.

And it is also advantageous if functional and insulating layers are arranged over one another on the sacrificial layer, which functional and insulating layers comprise on both sides parallel to the rolling direction the same rib-like structuring with regard to the number and geometry of the ribs.

It is likewise advantageous if functional and insulating layers are applied in which the side of the ribs that is arranged essentially parallel to the rolling direction of the layers and is part of the edge of the layer to be rolled up has a lateral length (B) of 10 to 200 µm.

It is further advantageous if functional and insulting layers are applied in which the side of the ribs that is arranged parallel to the rolling direction of the layers and is not part of the edge of the layer to be rolled up, or a corner of the ribs, is arranged at a distance (H) of 10 to 50 µm from the edge of the layer to be rolled up It is also advantageous if functional and insulating layers are applied in which the distance (D) between the ribs in the rolling direction is 20 to 500 µm.

And it is also advantageous if functional and insulating layers are applied in which the angle (α) between the side of the quadrilateral of the ribs that is first in the rolling direction and the edge of the layer to be rolled up outside the quadrilateral is between 30° and 120°, more advantageously 45°, and if the angle (β) between the side of the quadrilateral of the ribs that is last in the rolling direction and the edge of the layer to be rolled up outside the quadrilateral is between 80° and 120°, more advantageously 90°.

It is furthermore advantageous if the sacrificial layer is removed by means of etching or using organic solvents and/or water and/or ethylenediaminetetraacetic acid.

With the solution according to the invention, it is for the first time possible to specify a cost-effective, environmentally friendly and time-saving method for producing a rolled-up electrical or electronic component having a plurality of coils.

This is achieved by a method in which a sacrificial layer is applied to a rigid or flexible substrate, for example of silicon, silicon oxide, glass, ceramic, or a film, for example of poly(ethylene terephthalate) (PET) or polyether ether ketone (PEEK).

The sacrificial layer can for example be composed of water-soluble polymers, such as poly(vinyl alcohol) (PVA), poly(acrylic acid) (PAA), biopolysaccharides, cellulose acetate, poly(allylamine) (PAH), methylcellulose or ethylcellulose. Alternatively, any polymer that is stable in photolithographic process steps and can be wet-chemically or dry-chemically etched can be used. The sacrificial layer thereby has thicknesses of 5 nm-100 µm, advantageously less than 500 nm.

Either a functional layer or an insulating layer is then applied to the sacrificial layer, for example by means of atomic layer deposition and/or chemical vapor deposition. The material and the dimensions of the functional and insulating layers are based on the rolled-up electrical or electronic component that is to be produced.

For the production of a capacitor, for example, a layer stack is applied to the sacrificial layer, which layer stack is composed of a layer of at least one dielectric and/or electrically insulating material, a layer of at least one first electrically conductive material, an additional layer of at least one dielectric and/or electrically insulating material, and a layer of at least one second electrically conductive material, and in which layer stack the layers of the dielectric and/or electrically insulating material essentially completely cover the layers of the electrically conductive material.

Ti, Cr, Al, Au, Ni, Pd, Cu, W, Ta and compounds thereof, or indium tin oxide or highly doped semiconductor material can for example be used as material for electrically conductive layers, and $AlO_x$, advantageously $Al_2O_3$, $SiO_x$, advantageously $SiO_2$, $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $SiAlO_x$, metal nitrides, aluminum nitrides $AlN_y$, silicon nitrides $SiN_y$, $AlScN_y$, metal oxynitrides, aluminum oxynitrides $AlO_xN_y$, silicon oxynitrides $SiO_xN_y$, $HfSiO_xN_y$ and/or $SiC_zO_xN_y$ can for example be used as material for dielectric and/or insulating layers.

It is essential to the invention that at least the functional or insulating layer that is arranged directly on the sacrificial layer comprises a perforation at least on the two sides that are arranged essentially parallel to the rolling direction.

Within the scope of this invention, perforation is to be understood as meaning a type of toothing of the sides of the layers, which sides are arranged essentially parallel to the rolling direction, in the form of ribs that advantageously have a basic quadrilateral shape.

The perforation according to the invention is composed of a most regular possible arrangement of a plurality of geometrically identical or different ribs which, compared to the dimensions of the layers or the layer stack, have dimensions that are smaller by at least one order of magnitude, and which advantageously completely protrude, essentially parallel to the rolling direction, past the lateral edge of the layer or layers to be rolled up, and which, after the rolling-up of the layers, remain on the sacrificial layer as completely as possible and are no longer part of the rolled-up electrical or electronic component according to the invention.

Both the shape of the ribs and also the arrangement thereof in relation to the layers to be rolled up are thereby particularly important.

This perforation of at least the bottommost layer on the sacrificial layer functions as a predetermined breaking point during the rolling-up of the layer stack.

A predetermined breaking point is a construction element provided by constructive or mechanical or physical measures or designs.

According to the invention, ribs are used which have a basic quadrilateral shape and are at least part of the layer arranged directly on the sacrificial layer in the layer stack to be rolled up on the substrate and are arranged respectively parallel to the rolling direction at the lateral edges of the ribs.

The ribs are always materially connected to the layer by at least one side of the basic quadrilateral shape of the ribs. This side (B) has dimensions of 1 to 1000 µm, advantageously of 10 to 200 µm, and is always part of the edge of the respective layer and corresponds to the predetermined breaking point; that is, a separation of the layer material from the rib material should take place on this side during the rolling-up.

In the basic quadrilateral shape of the ribs, two sides of the quadrilateral are essentially parallel and as completely parallel as possible to the rolling direction, and two sides are embodied such that they are not parallel to the rolling direction. The one side parallel to the rolling direction is part of the edge of the layer to be rolled up, and the other side parallel to the rolling direction is located at a distance (H) from the edge of the layer to be rolled up, wherein the distance is 5 to 200 µm, advantageously 10 to 50 µm. The two non-parallel sides of the quadrilateral of the ribs are arranged at an angle to the rolling direction. The angle ($\alpha$) between the side of the quadrilateral of the ribs that is first in the rolling direction and the edge of the layer to be rolled up outside the quadrilateral is thereby between 15° and 135°, advantageously 30° to 120°, more advantageously 45°, and the angle ($\beta$) between the side of the quadrilateral of the ribs that is last in the rolling direction and the edge of the layer to be rolled up outside the quadrilateral is between 45° and 135°, advantageously 80° to 120°, more advantageously 90°.

The distance (D) between the ribs in the rolling direction is 20 to 4000 µm, advantageously 20 to 500 µm. This primarily concerns the distance between the ribs at the edge of the layer to be rolled up. It is also possible that a corner of one rib touches a corner of the adjacent rib and/or is materially bonded thereto. The hole formed between the ribs in this manner can then be embodied triangularly.

Advantageously, all functional and insulating layers that are arranged over one another on the sacrificial layer comprise the same perforation on both sides essentially parallel to the rolling direction.

It is also possible to produce different perforations with regard to the shape and size and distance from one another on both sides of the layer or layers. In this manner, a specific influencing of the rolling direction can be achieved and, for example, coils can be produced.

With the layer stack produced according to the invention, of which at least the bottommost layer on the sacrificial layer comprises a perforation with the shapes and dimensions of the ribs specified according to the invention, and which layer stack can have a rolling-up length of 1000 µm to 30 mm, the sacrificial layer is subsequently fully or partially removed. This takes place, for example, by means of etching or through the application of an organic solvent or water.

During the at least partial removal of the sacrificial layer, the layer stack is rolled up. The diameter of the rolled-up layer stack can be between 10 and 100 µm.

With the solution according to the invention, it becomes possible for the first time to roll up layer stacks for rolled-up electrical or electronic components with large rolling-up lengths in a reliable and straight manner in order to obtain a plurality of coils. This applies in particular to rolling up lengths from 1 mm to 30 mm.

In the solutions from the prior art, particularly the start of the rolling-up and, above all, the corners of a layer stack cause problems during the removal of the sacrificial layer, since the sacrificial layer is removed first and more quickly in the corners. After the rolling-up of the typically 0.5-1 mm length of the layer stack, the corners also roll up, so that it is often not possible to achieve a uniform rolling-up front and the rolling-up procedure is stopped.

With the method according to the invention, these different rolling-up speeds are now temporally and spatially equalized such that the force for the rolling up, particularly at the corners and on the sides of the layer stack to be rolled up, must be applied in the rolling direction at least partially for the removing and/or tearing-off of the ribs from the edge of the respective layer material during the rolling-up procedure.

The special geometric form of the ribs thereby ensures, during the rolling up, a reliable removal of the material of the ribs or the tearing-off of this material of the ribs from the layer stack to be rolled up. In the region of the holes of the perforation, the removal of the sacrificial layer is carried out over the distance between the ribs in the rolling direction without the layer material, so that during this period, little tension acts on the layer stack to be rolled up and the rolling-up procedure is thus carried out simply, gently and only in the rolling direction over the entire rolling-up front.

The invention is explained below in greater detail with the aid of several exemplary embodiments.

Wherein.

EXAMPLE 1

Capacitors

For the production of an ultra-compact microcapacitor having a plurality of coils, a layer of methylcellulose was spun in a centrifuge at a rotational speed of 4500 rpm (revolutions per minute) in a completely covering manner onto a silicon substrate with a length of 20 mm and a width of 5 mm with a 1-μm thick thermally applied silicon dioxide layer, and was subsequently baked and dried on a hot plate for 5 minutes at 120° C. This layer of methylcellulose, which was thinner than 5 nm, was the sacrificial layer.

Then, using the method of atomic layer deposition, an 11-nm thick $Al_2O_3$ layer was deposited at 150° C. such that it completely covered the sacrificial layer. This $Al_2O_3$ layer, which acts as a dielectric, also serves as an insulation layer between the two metallic electrodes following the rolling-up and as protection for the sacrificial layer against the subsequent process steps and air humidity.

With the aid of optical photolithography, the first electrode of the capacitor was structured with a length of 10 mm in the rolling direction and a width of 0.6 mm. By means of electron beam evaporation, a tensioned electrically conductive layer composed of 15 nm Ti and subsequently 20 nm Cr were deposited each at a rate of 0.1 nm/s and subsequently lifted off. The layer comprised a perforation with ribs having a basic quadrilateral shape on both sides of the layer parallel to the rolling direction and was achieved using a mask during the deposition of the layer. The perforation was composed on both sides of geometrically identical and equally sized ribs, was adapted to the expected rolling diameter of 50 μm, and had the following dimensions:

Height of the ribs: H=9 μm,
Width of the ribs at the edge of the layer: B=25 μm,
Distance between the ribs at the edge of the layer: D=25 μm,
First angle in the rolling direction: $\alpha=21°$,
Second angle in the rolling direction: $\beta=78°$.

Then, a second 11-nm thick $Al_2O_3$ layer was once again deposited by means of atomic layer deposition at 150° C. such that it completely covered the first electrically conductive layer, albeit without perforation on the sides.

After optical lithography for the second electrode, the deposition of the second electrically conductive layer, also once again without any rib-like structuring one the sides, of 10 nm Cr took place at a rate of 0.1 nm/s and with a subsequent lift-off. Finally, the protruding sacrificial layer was removed using water, and the tensioned layer stack was rolled up at a speed of 2 mm/min.

Through the use of the perforation according the invention, it was possible to consistently carry out the rolling-up procedure over the entire rolling-up length across the entire rolling-up front in the rolling direction and at a high rolling-up speed.

In this manner, it was possible to produce a rolled-up capacitor using a cost-effective, environmentally friendly and time-saving method.

Figure 1:
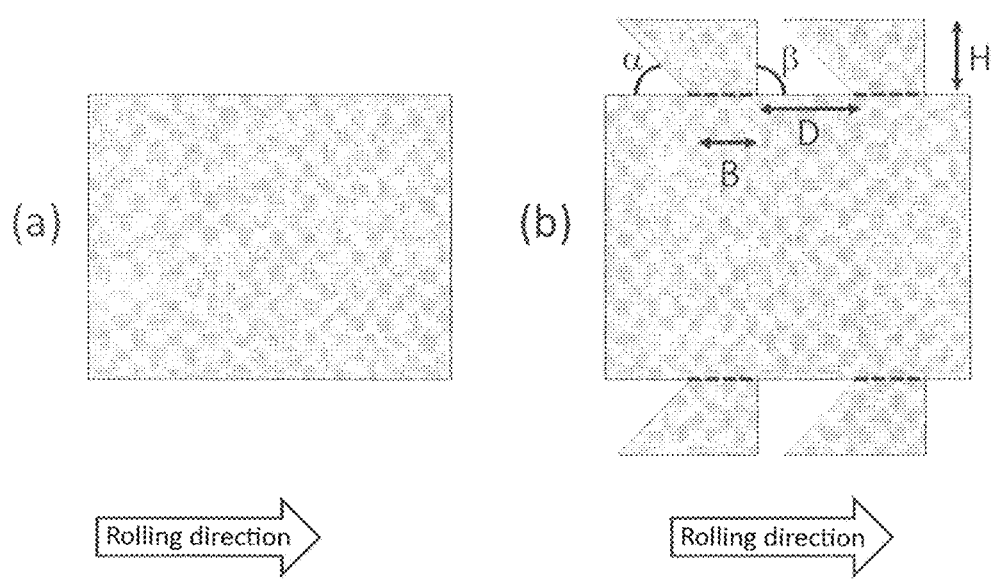
FIG. 1a shows a layer to be rolled up, according to the prior art
FIG. 1b shows a layer to be rolled up, with a perforation
Figure 2:
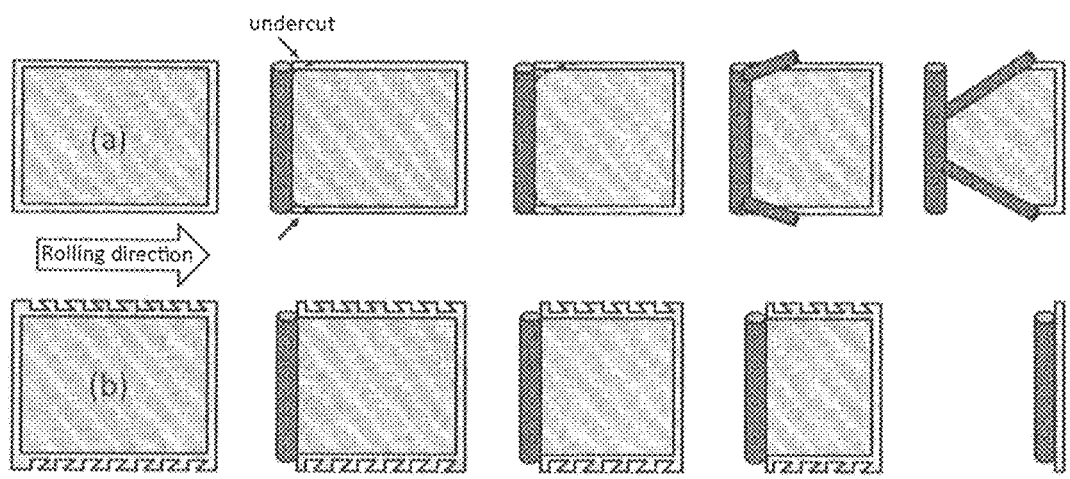
FIG. 2a shows a diagram of the rolling process for a layer according to the prior art
FIG. 2b shows a diagram of the rolling process for a layer with a perforation FIG. 3 show an exemplary embodiment for production of a capacitor
Figure 3:
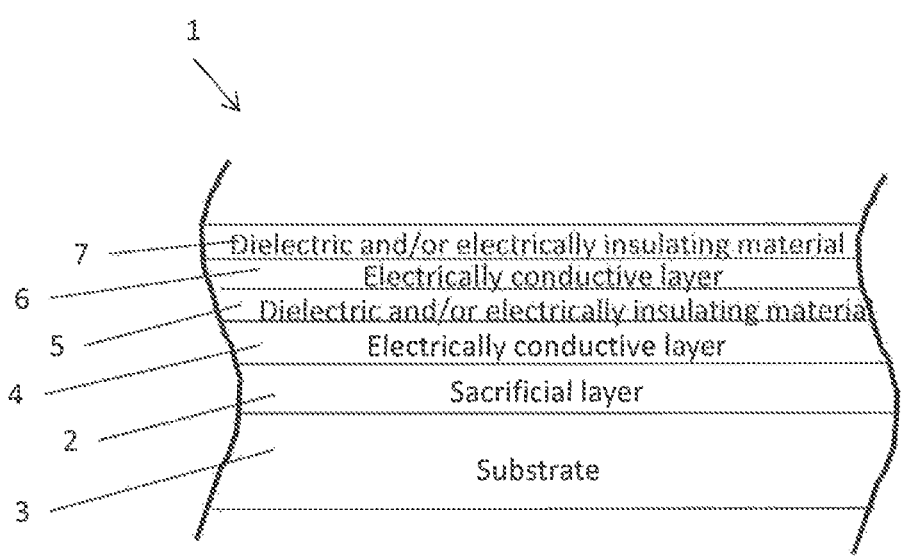

FIG. 3 illustrates an exemplary embodiment for the production of a capacitor, for example, a layer stack 1 is applied to the sacrificial layer 2 of substrate 3, which layer stack 1 is composed of a layer 4 of at least one dielectric and/or electrically insulating material, a layer 5 of at least one first electrically conductive material, an additional layer 6 of at least one dielectric and/or electrically insulating material, and a layer 7 of at least one second electrically conductive material, and in which layer stack 1 the layers 4, 6 of the dielectric and/or electrically insulating material essentially completely cover the layers 5, 7 of the electrically conductive material.

EXAMPLE 2

Antenna

For the production of a three-dimensional antenna, a layer of a 4% (w/v) diluted poly(acrylic acid) (PAA) was spun at 3000 rpm in a completely covering manner onto a 22×22 $mm^2$ glass substrate with a thickness of 200 μm. The final layer thickness of this sacrificial layer was 500 nm. This layer was dried at 35° C. for 2 minutes and then immersed in a 1-molar solution of $CaCl_2$ in deionized (DI) water. The coated substrate was subsequently washed in DI water and dried. By means of standard photolithography, the base surface of the antenna was structured using AR-P3510 photoresist. The PAA sacrificial layer was removed at the uncoated sites using undiluted AR300-35 developer and washed in DI water, The photoresist was removed in acetone, and the coated substrate was washed in isopropanol and dried. A tensioned layer stack of organic materials was applied to this sacrificial layer. The first layer was composed of PAA ($M_w$=150000) and PVA at a ratio of 1:1, 4% (w/v) diluted in water. The second layer was composed of polyimide ($M_w$=100000), 2% (w/v) diluted in N-methyl-2-pyrrolidone. The first polymer layer was applied at 8000 rpm to the sacrificial layer over the entire area with a resulting layer thickness of 500 nm. This layer was structured by means of standard photolithography and undiluted developer, wherein the layer comprised on both sides of the layer parallel to the rolling direction the perforation with ribs having a basic quadrilateral shape and the following dimensions:

Height of the ribs: H=200 μm,
Width of the ribs at the edge of the layer: B=100 μm,
Distance between the ribs at the edge of the layer: D=300 μm,
First angle in the rolling direction: $\alpha=45°$,
Second angle in the rolling direction: $\beta=90°$.

The perforation was composed on both sides of geometrically identical and equally sized ribs.

The deposition of the metal layer on the tensioned layer without perforation followed. For this purpose, the photoresist was structured by means of standard photolithography and Ta(10 nm)/Cu(100 nm)/Ta(10 nm) was deposited by means of magnetron sputtering. During this step, Ar at a partial pressure of 0.1 Pa was used as a sputtering gas. The lift-off took place with acetone and a subsequent rinsing in isopropanol.

The planar, two-dimensional structures produced in such a manner with a footprint of 5.5×17 $mm^2$ were rolled up into three-dimensional helical antennas by removal from the substrate. The removal was achieved by means of selective etching of the sacrificial layer in a 0.5-molar ethylenediaminetetraacetic acid (EDTA) solution. After the rolling process, the antennas were washed in DI water and dried in air. The diameter of the rolled-up antenna was 300 μm, and the length after the rolling was 5.5 mm.

Through the use of the perforation according the invention, it was possible to consistently carry out the rolling-up procedure over the entire rolling-up length across the entire rolling-up front in the rolling direction and at a high rolling-up speed.

In this manner, it was possible to produce a rolled-up antenna using a cost-effective, environmentally friendly and time-saving method.

The invention claimed is:

1. A method for producing a rolled-up electrical or electronic component comprising:
    applying at least two functional layers and at least two insulating layers that are alternately arranged fully or partially over one another to a substrate having a sacrificial layer,
    wherein at least one of the functional or insulating layer is arranged directly on the sacrificial layer and comprises a row of perforations at least on sides arranged essentially parallel to a rolling direction.

2. The method according to claim 1, wherein the row of perforations is composed of a rib-like structuring and the ribs have a basic quadrilateral shape.

3. The method according to claim 1, wherein a rigid or flexible material is used as a substrate.

4. The method according to claim 1, wherein the a substrate comprises silicon, silicon oxide, glass, ceramic, or a film of poly(ethylene terephthalate) (PET) or polyether ether ketone (PEEK), and the sacrificial layer comprises poly(vinyl alcohol) (PVA), poly(acrylic acid) (PAA), biopolysaccharides, cellulose acetate, poly(allylamine) (PAH), methylcellulose or ethylcellulose.

5. The method according to claim 1, wherein layers of an electrically conductive material are applied to the functional layers and layers of a dielectric and/or electrically insulating material are applied to the insulating layers by at least one of atomic layer deposition and/or chemical vapor deposition.

6. The method according to claim 5, wherein the electrically conductive layers comprise Ti, Cr, Al, Au, Ni, Pd, Cu, W, Ta and compounds thereof, or indium tin oxide or highly doped semiconductor material.

7. The method according to claim 1, wherein the at least two functional and insulating layers form a layer stack applied to the sacrificial layer, the layer stack being composed of a layer of at least one dielectric and/or electrically insulating material, a layer of at least one first electrically conductive material, an additional layer of at least one dielectric and/or electrically insulating material, and a layer of at least one second electrically conductive material,
wherein the layers of the dielectric and/or electrically insulating material essentially completely cover the layers of the electrically conductive material.

8. The method according to claim 1, wherein the dielectric and/or insulating layers comprise AlOx, SiOx, AlTiOx, SiTiOx, HfOx, TaOx, ZrOx, HfSiOx, ZrSiOx, TiZrOx, TiZrWOx, TiOx, SrTiOx, PbTiOx, SiAlOx, metal nitrides such as aluminum nitrides AlNy, silicon nitrides SiNy, AlScNy, metal oxynitrides such as aluminum oxynitrides AlOxNy, silicon oxynitrides SiOxNy, HfSiOxNy and/or SiCzOxNy.

9. The method according to claim 8, wherein AlOx comprises $Al_2O_3$ and SiOx comprises $SiO_2$.

10. The method according to claim 1, wherein the at least one functional or insulating layer that is applied directly to the sacrificial layer has a rolling-up length of 1 mm to 30 mm.

11. The method according to claim 1, wherein the sacrificial layer is removed by etching or using organic solvents and/or water and/or ethylenediaminetetraacetic acid.

12. A method for producing a rolled-up component comprising:
applying at least two functional and insulating layers that are alternately arranged fully or partially over one another to a substrate having a sacrificial layer,
wherein at least one of the functional or insulating layer is arranged directly on the sacrificial layer and comprises a perforation at least on sides arranged essentially parallel to a rolling direction,
wherein the perforation is composed of a rib-like structuring and the ribs have a basic quadrilateral shape, and
wherein quadrilateral shape of the ribs includes:
one of the sides of the ribs being arranged essentially parallel to the rolling direction of the layers and being part of the edge of the layer to be rolled up and has a lateral length of 1 to 1000 µm;
an other side of the ribs being essentially parallel to the rolling direction of the layers is arranged at a distance of 5 to 200 µm from the edge of the layer to be rolled up;
wherein a distance between the ribs in a direction essentially parallel to the rolling direction is 20 to 4000 µm, and an angle between an end of the other side of the ribs that is first in the rolling direction and the edge of the layer to be rolled up outside the rib is between 15° and 135°, and an angle between an end of the other side of the ribs that is last in the rolling direction and the edge of the layer to be rolled up outside the rib is between 45° and 135°, and
subsequently removing the sacrificial layer at least fully or partially; and
rolling up the layer stack.

13. A method for producing a rolled-up component comprising:
applying at least two functional and insulating layers that are alternately arranged fully or partially over one another to a substrate having a sacrificial layer,
wherein at least one of the functional or insulating layer is arranged directly on the sacrificial layer and comprises a perforation at least on sides arranged essentially parallel to a rolling direction, and
wherein the at least two functional and insulating layers are alternately arranged over one another on the sacrificial layer and comprise ribs on sides parallel to a rolling direction that have a same rib-like structuring with regard to a number and geometry of the ribs.

14. The method according to claim 13, wherein the ribs of the applied functional and insulating layers have sides arranged essentially parallel to the rolling direction of the layers that are part of the edge of the layer to be rolled up, these sides having a lateral length of 10 to 200 µm.

15. The method according to claim 13, wherein the ribs of the applied functional and insulting layers have sides arranged parallel to the rolling direction of the layers that neither part of the edge of the layer to be rolled up nor a corner of the ribs, these sides being arranged at a distance of 10 to 50 µm from the edge of the layer to be rolled up.

16. The method according to claim 13, wherein a distance in the rolling direction between the ribs of the applied functional and insulating layers is 20 to 500 µm.

17. The method according to claim 13, wherein the ribs of the applied functional and insulating layers have a quadrilateral structure in which an angle ($\alpha$) between a side of the quadrilateral structure that is first in the rolling direction and the edge of the layer to be rolled up outside the quadrilateral structure is between 30° and 120°, more advantageously 45°, and an angle ($\beta$) between a side of the quadrilateral structure that is last in the rolling direction and the edge of the layer to be rolled up outside the quadrilateral structure is between 80° and 120°, more advantageously 90°.

18. The method according to claim 17, wherein the angle ($\alpha$) is 45° and the angle ($\beta$) is 90°.

* * * * *